US010812089B2

(12) United States Patent
Leung et al.

(10) Patent No.: US 10,812,089 B2
(45) Date of Patent: Oct. 20, 2020

(54) APPARATUS AND METHOD TO REDUCE LOCK TIME VIA FREQUENCY BAND CALIBRATION

(71) Applicant: Xilinx, Inc., San Jose, CA (US)

(72) Inventors: Caleb S. Leung, San Jose, CA (US); Edward Lee, Mountain View, CA (US); Alan C. Wong, San Jose, CA (US); Christopher J. Borrelli, Los Gatos, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/357,169

(22) Filed: Mar. 18, 2019

(65) Prior Publication Data
US 2020/0304130 A1 Sep. 24, 2020

(51) Int. Cl.
*H03L 7/099* (2006.01)
*H03K 19/177* (2020.01)
*H03L 7/08* (2006.01)
(52) U.S. Cl.
CPC .......... *H03L 7/099* (2013.01); *H03K 19/177* (2013.01); *H03L 7/0807* (2013.01)
(58) Field of Classification Search
CPC ...... H03L 7/099; H03L 7/0807; H03K 19/177
USPC .................. 375/371, 376; 327/159; 455/260
See application file for complete search history.

(56) References Cited

U.S. PATENT DOCUMENTS

| 5,572,159 A | 11/1996 | McFarland |
| 6,512,419 B1 | 1/2003 | Adams et al. |
| 6,593,789 B2 | 7/2003 | Atallah et al. |
| 6,603,337 B2 | 8/2003 | Cho |

(Continued)

FOREIGN PATENT DOCUMENTS

| WO | 0133249 A2 | 5/2001 |
| WO | 0133249 A3 | 12/2001 |

OTHER PUBLICATIONS

Agarwal K. et al., A Duty-Cycle Correction Circuit for High-Frequency Clocks, IEEE 2006 Symposium on VLSI Circuits Digest of Technical Papers, IBM, Austin, TX 78758, 2 pages.

(Continued)

*Primary Examiner* — Fitwi Y Hailegiorgis
(74) *Attorney, Agent, or Firm* — Patterson + Sheridan, LLP

(57) ABSTRACT

Apparatus and associated methods relating to reducing lock time include pre-calibrating and storing phase-locked loop (PLL) and/or injection-locked oscillator (ILO) adaptation values during startup and loading the pre-calibrated values during rate change. In an illustrative example, an integrated circuit may include a controllable frequency circuit operable at frequencies within each of a plurality of frequency bands. A data store may store operational settings associated with each frequency of the plurality of frequency bands. A state machine may be coupled to the controllable frequency circuit and the data store configured to select a predetermined frequency band in response to a command signal, retrieve, from the data store, operational settings associated with the predetermined frequency band, and, apply the retrieved operational settings to the controllable frequency circuit. With the pre-calibration, PLL and/or ILO lock times during rate change in a multi-rate serializer/deserializer (SERDES) link may be advantageously reduced.

20 Claims, 5 Drawing Sheets

(56) References Cited

U.S. PATENT DOCUMENTS

| | | | |
|---|---|---|---|
| 7,062,692 B1 | 6/2006 | Lesea | |
| 9,006,740 B1* | 4/2015 | Nagarajan | H04B 10/0731 |
| | | | 257/48 |
| 9,602,082 B2 | 3/2017 | Hedayati et al. | |
| 10,079,607 B1 | 9/2018 | Grens et al. | |
| 2007/0159224 A1 | 7/2007 | Dwarka et al. | |
| 2007/0173219 A1* | 7/2007 | Kim | H03L 7/099 |
| | | | 455/260 |
| 2012/0262239 A1* | 10/2012 | Taghivand | H03L 7/18 |
| | | | 331/16 |
| 2013/0249610 A1* | 9/2013 | Hara | H03L 7/00 |
| | | | 327/159 |
| 2014/0120847 A1 | 5/2014 | Shima | |
| 2014/0270030 A1* | 9/2014 | Hammad | H04L 7/0079 |
| | | | 375/371 |
| 2015/0229316 A1 | 8/2015 | Walker et al. | |

OTHER PUBLICATIONS

Yoo J., et al., Open-loop Full-Digital Duty Cycle Correction Circuit, Electronics Letters, May 26, 2005,vol. 41 No. 11, 2 pages.

Huh H., et. al., "Comparison frequency doubling and charge pump matching techniques for dual-band $\Delta\Sigma$ fractional-N frequency synthesizer", IEEE Journal of Solid-State Circuits, vol. 40, No. 11, Nov. 2005, pp. 2228-2236.

Galton, Ian, "Delta-Sigma Fractional-N Phase-Locked Loops", 11 pages, 2017.

Jaewook Shin et al : "A Fast and High-Preci sion VCO Frequency Calibration Techni que for Wi deband $\Delta\Sigma$ Fractional -N Frequency Synthesizers" , IEEE Transactions on Circuits and Systems I: Regular Papers, IEEE, US, vol. 57, No. 7, Jul. 1, 2010 (Jul. 1, 2010).

* cited by examiner

APPARATUS AND METHOD TO REDUCE LOCK TIME VIA FREQUENCY BAND CALIBRATION

TECHNICAL FIELD

Various embodiments relate generally to frequency band calibration.

BACKGROUND

Data represents information that has useful value. Data can take the form of stored information. Data storage can be in analog form. Data storage can also be in digital form. Data in digital format may be communicated between two nodes. When data is communicated, for example, it can be received and interpreted as a function of time. Some systems that receive communicated digitally-formatted data may be based on a clock that determines when a voltage signal is sampled to decide whether a symbol in a data stream is, for example, a one or a zero. Sometimes, data may be received without knowing its specific phase information. Phase alignments may be performed before launching data or receiving data to ensure data accuracy and data integrity.

SUMMARY

Apparatus and associated methods relating to reducing lock time include pre-calibrating and storing phase-locked loop (PLL) and/or injection-locked oscillator (ILO) adaptation values during startup and loading the pre-calibrated values during rate change. In an illustrative example, an integrated circuit may include a controllable frequency circuit operable at frequencies within each of a plurality of frequency bands. A data store may store operational settings associated with each frequency of the plurality of frequency bands. A state machine coupled to the controllable frequency circuit and the data store may be configured to select a predetermined frequency band in response to a command signal, retrieve, from the data store, operational settings associated with the predetermined frequency band, and, apply the retrieved operational settings to the controllable frequency circuit. With the pre-calibration, PLL and/or ILO lock times during rate change in a multi-rate serializer/deserializer (SERDES) link may be advantageously reduced.

Various embodiments may achieve one or more advantages. For example, some embodiments may speedup the lock time of the PLL and/or the ILO. Some embodiments may be flexibly employed, for example, in a programmable logic, such as a field programmable gate array (FPGA) that may permit frequency band and/or rate change operation to be reconfigurable in the field. In some embodiments, cost, size or power may be reduced, for example, by implementation on a fixed hardware platform, such as an application-specific integrated circuit (ASIC). Some implementations may involve execution of preprogrammed instructions and/or software executed by a processor to achieve reduced lock times when changing rates in frequency controlled circuits. In some embodiments, the apparatus and/or the method may enable the PLL and/or the ILO to work for a wide range of protocols, such as peripheral component interconnect express (PCIe). In various embodiments, the apparatus and/or the method may cost-effectively avoid the need to use a dedicated narrow band PLL. In some embodiments, fewer hardware resources may be employed, and a smaller area may be achieved by sharing the pre-calibration circuit and/or the state machine by different transceivers.

In one exemplary aspect, an integrated circuit includes a controllable frequency circuit operable at frequencies within each of a plurality of frequency bands. A data store is configured to store operational settings associated with each frequency band of the plurality of frequency bands. The integrated circuit also includes a state machine coupled to the controllable frequency circuit and the data store configured to select a predetermined frequency band in response to a command signal, retrieve operational settings associated with the predetermined frequency band from the data store, and apply the retrieved operational settings to the controllable frequency circuit.

In some embodiments, the controllable frequency circuit may include a phase-locked loop (PLL). The PLL may include a voltage-controlled oscillator (VCO). In some embodiments, the controllable frequency circuit may include an injection-locked oscillator (ILO). In some embodiments, the command signal may be associated with a change of operation in a first one of the frequency bands to a second one of the frequency bands. In some embodiments, the integrated circuit may also include a pre-calibration circuit operable to pre-calibrate the controllable frequency circuit to generate the operation settings. The pre-calibration circuit (250a) may be configured to pre-calibrate decision feedback equalizer (DFE) parameters of a serializer/deserlizer (SERDES) link. The pre-calibration circuit (250a) may also be configured to pre-calibrate clock data recovery (CDR) parameters of a serializer/deserlizer (SERDES) link.

In some embodiments, the state machine may be configured to enable the pre-calibration circuit to perform an auto frequency band selection for the controllable frequency circuit to generate the operational settings. In some embodiments, the state machine may also be configured to disable the pre-calibration circuit (250b) in response to generation of the operational settings.

In another exemplary aspect, a method to configure a controllable frequency circuit includes receiving a user command signal, by a state machine, to configure a controllable frequency circuit to generate a desired frequency. The method also includes selecting a predetermined frequency band in response to the command signal, retrieving corresponding operational settings associated with the predetermined frequency band, and applying the retrieved operational setting to the controllable frequency circuit.

In some embodiments, the controllable frequency circuit may include a phase-locked loop (PLL). The PLL may include a voltage-controlled oscillator (VCO). In some embodiments, the controllable frequency circuit may include an injection-locked oscillator (ILO). The ILO may include a voltage-controlled oscillator (VCO). In some embodiments, the controllable frequency circuit may include a phase-locked loop (PLL) connected with an injection-locked oscillator (ILO) in series.

In some embodiments, the corresponding operational settings may be pre-calibrated by predetermining one or more desired frequencies f(n) to be generated by the controllable frequency circuit, enabling, by the state machine, a pre-calibration circuit to perform an automatic frequency band selection, setting the controllable frequency circuit to the frequency f(n), reading and storing a corresponding frequency band and operational parameters in the data store when the frequency f(n) is locked, and disabling the automatic frequency band selection until each of the one or more frequency f(n) has a corresponding frequency band and operational parameters.

In some embodiments, the pre-calibration circuit may pre-calibrate decision feedback equalizer (DFE) parameters of a serializer/deserlizer (SERDES) link. In some embodiments, the pre-calibration circuit may pre-calibrate clock data recovery (CDR) parameters of a serializer/deserlizer (SERDES) link. In some embodiments, the command signal may be associated with a change of operation in a first one of the frequency bands to a second one of the frequency bands.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Figure 4:
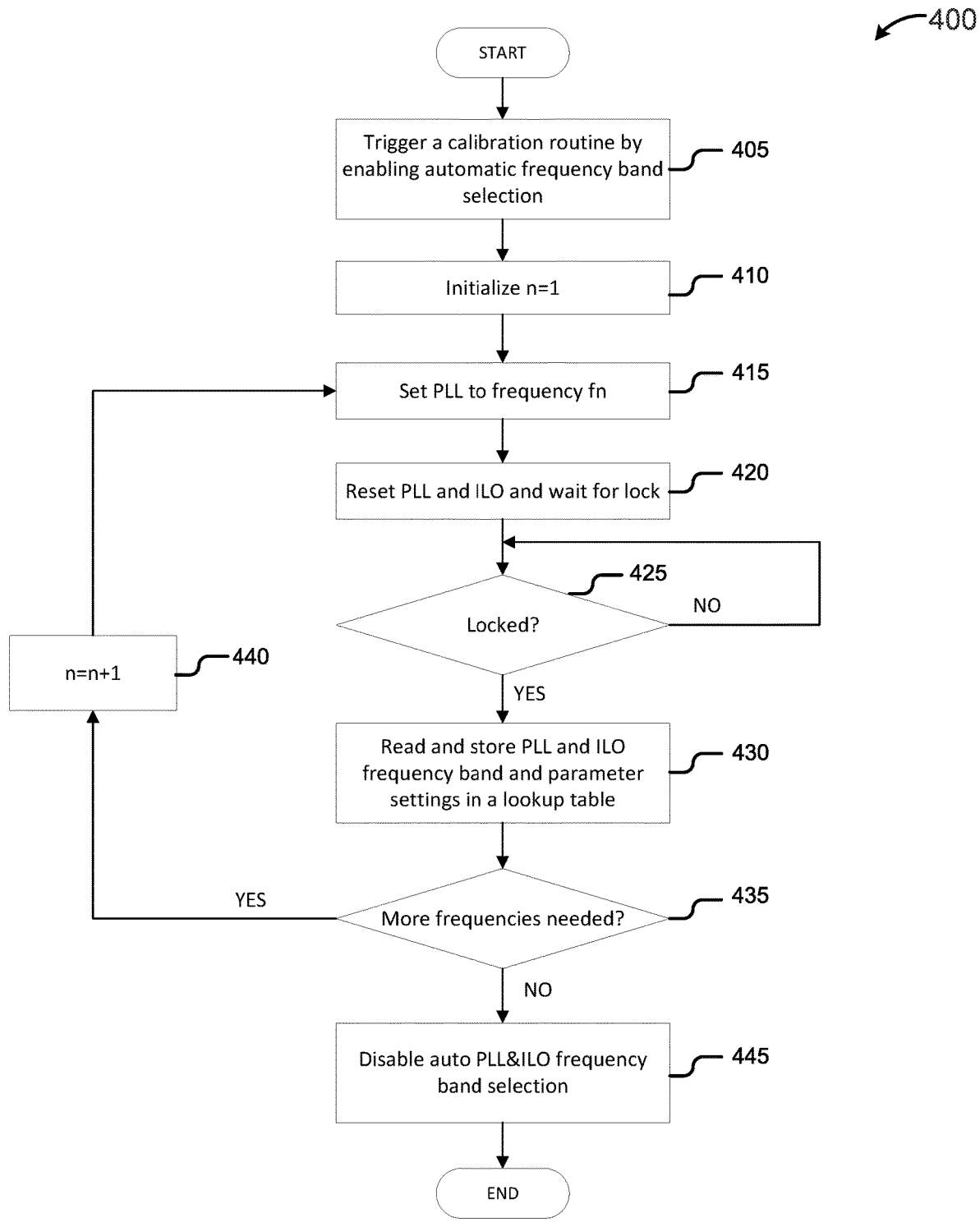
FIG. 4 depicts a flow chart of an exemplary method to pre-calibrate the controllable frequency circuit.

To aid understanding, this document is organized as follows. First, an exemplary platform (e.g., FPGA) suitable to perform a PLL and/or ILO calibration is briefly introduced with reference to FIG. 1. Second, with reference to Fogs 2-3B, the discussion turns to introduce how adaptation values of a PLL and/or an ILO are pre-calibrated and stored to load during rate change. Third, FIG. 4 is described to introduce how to pre-calibrate the PLL and/or the ILO. Finally, with reference to FIG. 5, the discussion discloses exemplary implementations of the frequency band calibration at run-time.

Figure 1:
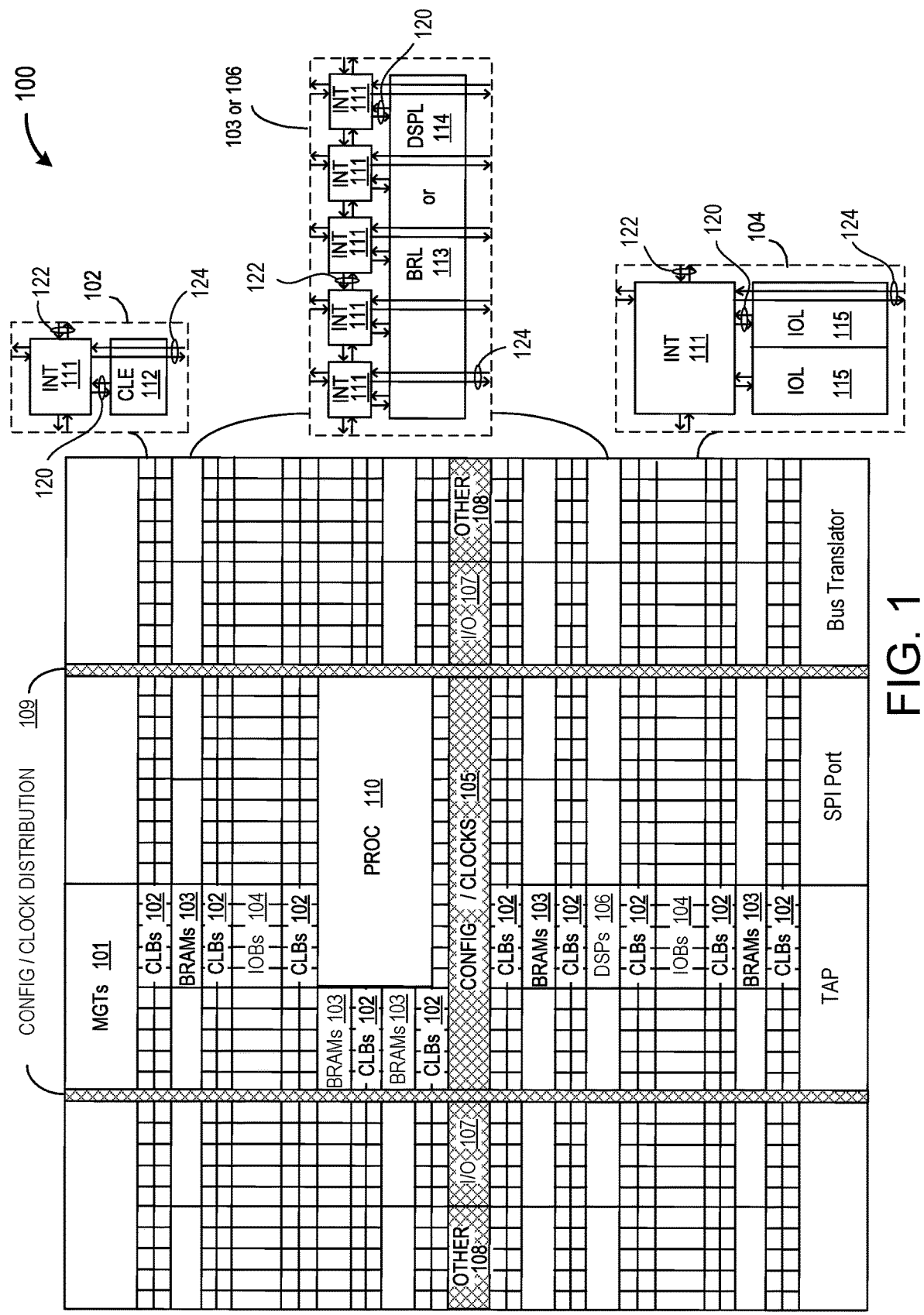
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

At least one transceiver may be embedded in an FPGA to perform data transmitting and data receiving during communication. Data may be transmitted or received at different frequencies. Phase-locked loops (PLLs) and/or injection-locked oscillators (ILOs) may be used by the transceiver to generate clock signals with different frequencies and/or phases. A wide range of frequency outputs may need to be supported as different customers may use the FPGA at different frequencies with various protocols.

Figure 2:
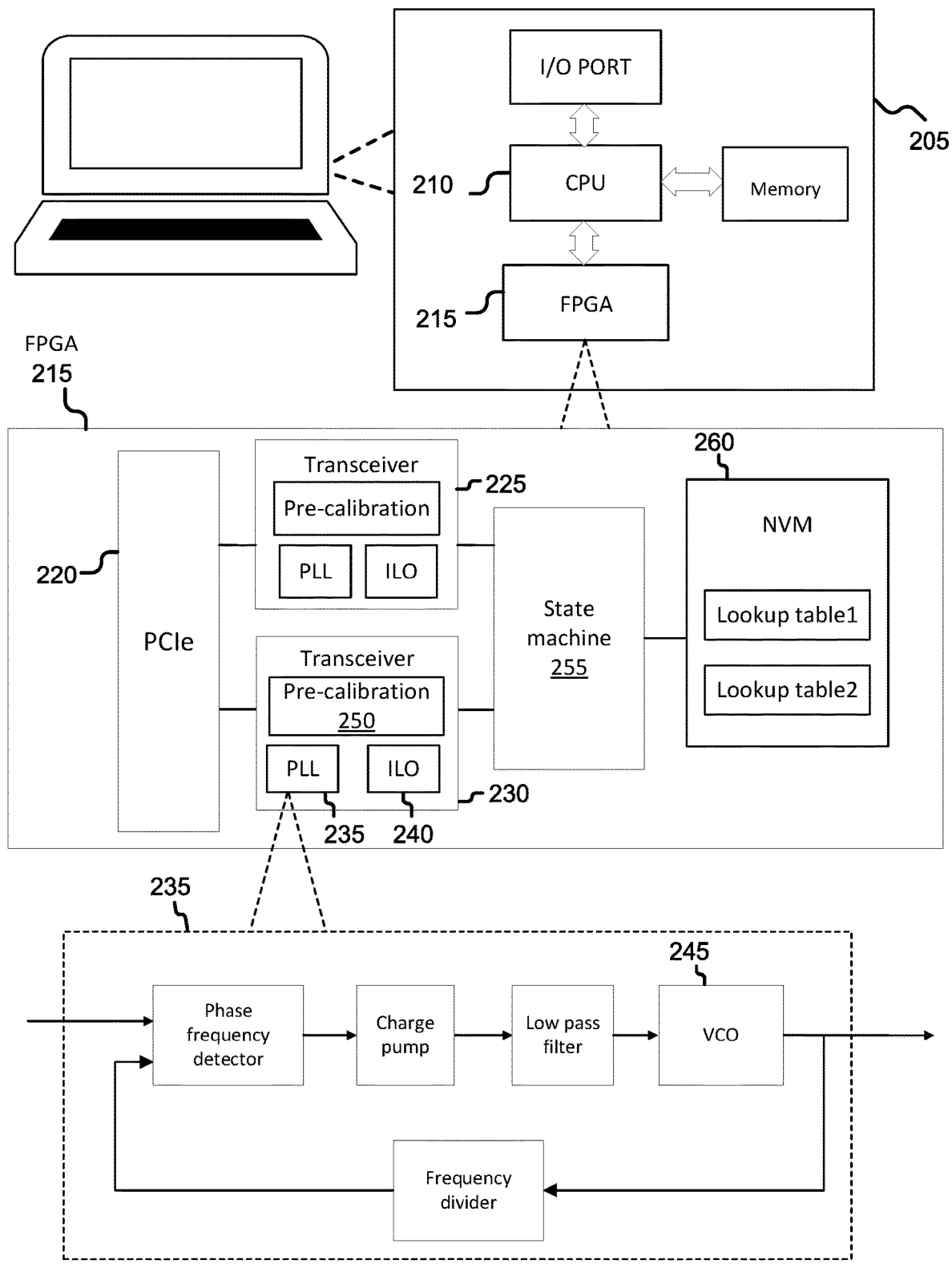
FIG. 2 depicts an exemplary controllable frequency circuit implemented in a high-speed digital computing system.

FIG. 2 depicts an exemplary controllable frequency circuit implemented in a high-speed digital computing system. A high-speed digital computing system 205 includes multiple interconnected circuit subsystems, one of which is a central processing unit (CPU) 210 electrically connected with an FPGA 215. The FPGA 215 may include many high-speed data transmission lines.

In this depicted example, the FPGA 215 includes a peripheral component interconnect express (PCIe) unit 220. The PCIe unit 220 is configured to connect the FPGA 215 to the CPU 210. The FPGA 215 also includes a first transceiver 225 and a second transceiver 230 configured to perform data transfers.

In this depicted example, each of the first transceiver 220 and the second transceiver 225 includes a controllable frequency circuit to generate one or more desired clock signals needed during data transfer. In this depicted example, the controllable frequency circuit includes a phase-locked loop (PLL) 235 and/or an injection-locked oscillator (ILO) 240.

The PLL 235 of the depicted example having a voltage controlled oscillator (VCO) 245 may be used to generate clock signals with different frequencies. To support the wide range of frequencies, the VCO 245 for the PLL 235 and/or the ILO 240 may be configured to work in multiple frequency bands. To select an optimal frequency band, when the controllable frequency circuit (e.g., PLL 235 and/or the ILO 240) attempts to lock to a frequency, a pre-calibration circuit 250 may step through various frequency bands, monitor the VCO 255 voltage to see if it is within an ideal range, and adjust if necessary. The pre-calibration circuit 250 is configured to calibrate the controllable frequency circuit (e.g., the PLL 235 and/or the ILO 240) during a serializer/deserializer (SERDES) link rate change, for example. In some embodiments, the pre-calibration circuit 250 may be arranged off-chip. In this depicted example, the pre-calibration circuit 250 is arranged in the FPGA 215.

In various examples, some protocols may have strict requirements for rate change time. For example, for PCIe, there is a 1 ms lock time specification that needs to be met. To reduce the lock time, a state machine 255 is introduced to control the pre-calibration circuit 250. The state machine 255 controls the pre-calibration circuit 250 in the transceiver 230. More specifically, the state machine 255 enables or disables the pre-calibration circuit 250 to perform auto frequency band selection for the PLL 235 and/or the ILO 240. The state machine 255 may also be configured to receive one or more user command signals through a user input interface. For example, a serializer/deserializer (SERDES) link may use four different frequencies $f_1$ (e.g., 2.5 Gb/s), $f_2$ (e.g., 5.0 Gb/s), $f_3$ (e.g., 8.0 Gb/s), and $f_4$ (e.g., 16.0 Gb/s) for PCIe. The user may input those four frequencies into the state machine 255. The state machine 255 may enable the pre-calibration circuit 250 to calibrate the four frequencies during startup. When the pre-calibration circuit 250 performs a corresponding frequency (e.g., the frequency $f_1$) calibration and the controllable frequency circuit (e.g., the PLL 235 and/or the ILO 240) is locked for the frequency (e.g., the frequency $f_1$), the calibrated settings relating to obtaining the frequency $f_1$ may be stored in a non-volatile memory (NVM) 260. When all the four different frequencies $f_1$, $f_2$, $f_3$, and $f_4$ are pre-calibrated, and corresponding settings are obtained, one or more lookup tables may be formed and stored in the NVM 260. The calibrated values may be then loaded to the controllable frequency circuit (e.g., the PLL 235 and/or the ILO 240) during a SERDES rate change, for example.

Although, in this depicted example, the state machine 255 is placed on the same programmable logic (e.g. the FPGA 215) with the transceivers 225/230, in various embodiments, the state machine 255 may be implemented in a different programmable logic (e.g., another FPGA) to control the pre-calibration.

In some embodiments, the state machine 255 may be implemented as hard block fixed circuitry. For example, an application specific integrated circuit (ASIC) may provide a state machine for controlling the pre-calibration. In some embodiments, some or all of the functions of the state machine 255 may be implemented in a processor that is configured to execute a set of instructions stored in a data store to control the pre-calibration. The processor may be arranged on the same integrated circuit, which may be an FPGA (e.g., the FPGA 215) with the transceiver 230. For example, the state machine 255 and data store (e.g., the NVM 260) may be implemented in a programmable logic block of a system-on-chip (SoC) or implemented in a hard block using fixed circuitry of the SoC, and the transceiver 230 may be implemented in another hard block using fixed circuitry of the SoC.

Figure 3A:
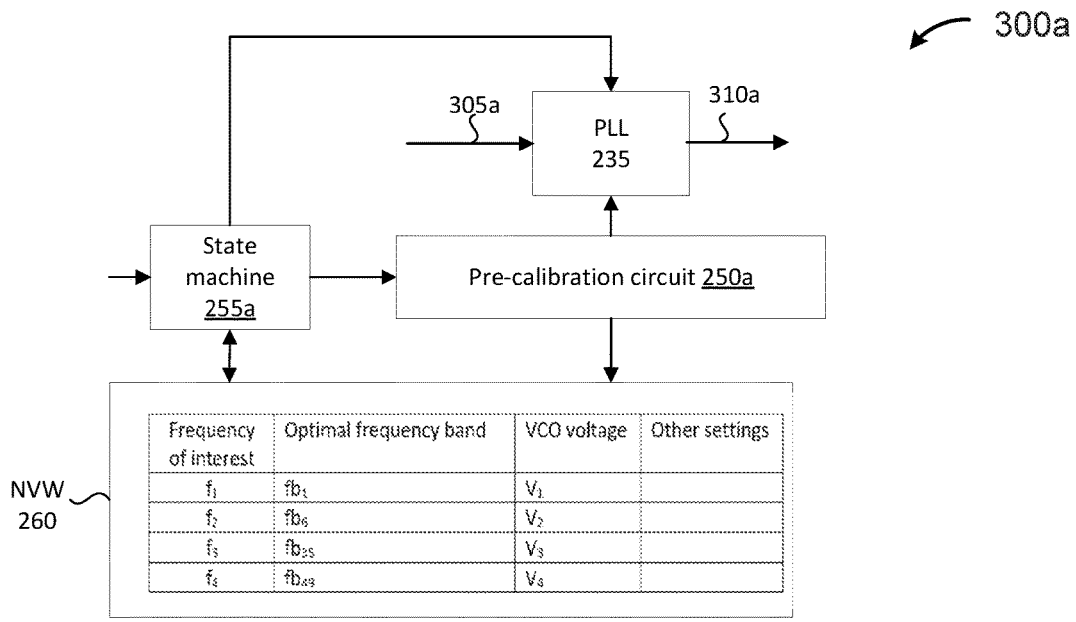
FIG. 3A depicts an exemplary clock signal generator embedded in the FPGA.

FIG. 3A depicts an exemplary clock signal generator embedded in the FPGA. An exemplary clock signal generator 300a includes a controllable frequency circuit. In this depicted example, the controllable frequency circuit includes a PLL (e.g., the PLL 235). The PLL 235 receives an input clock signal 305a and generates an output clock signal 310a. The PLL 235 may be set to generate different output clock signals 310a with different frequencies. In some embodiment, the controllable frequency circuit may be configured with an ILO (e.g., the ILO 240) to replace the PLL 235 to generate clock signals with different phases.

The clock signal generator 300a also includes a pre-calibration circuit 250a connected to the PLL 235. When used in a multi-rate SERDES link, multiple frequencies may be needed. The multiple frequencies may be predetermined by the user. The pre-calibration circuit 250a may step through various frequency bands and monitor the VCO (e.g., the VCO 245) voltage to see if the VCO 245 is within an ideal range. When the PLL 235 is locked, corresponding frequency band and operational settings of the PLL 235 to generate the locked frequency may be obtained.

The pre-calibration circuit 250a is controlled by a state machine 255a. The state machine 255a controls the pre-calibration circuit 250 to start the pre-calibration at startup and stop calibration when all predetermined frequencies have corresponding frequency band and operational settings. A lookup table is established during startup calibration and may be used during rate change. In this depicted example, the lookup table is stored in a nonvolatile memory (e.g., the NVM 260).

The state machine 255a, which may be configured with a user interface, allows the user to select a frequency band and operational settings in a manual override mode from the lookup table during PLL rate change and configure the PLL 235 with the selected frequency band and operational settings. By directly selecting adaption values stored from startup calibration, there is no longer a need to sweep through different PLL frequency bands during PLL lock. Therefore, the lock time is reduced significantly. In some embodiments, the pre-calibration circuit 250a may be configured to calibrate other SERDES link adaptation parameters. For example, decision feedback equalizer (DFE) parameters and/or clock data recovery (CDR) parameters may be pre-calibrated and stored. The pre-calibration may reduce the adaption and link lock time for the SERDES as well.

Figure 3B:
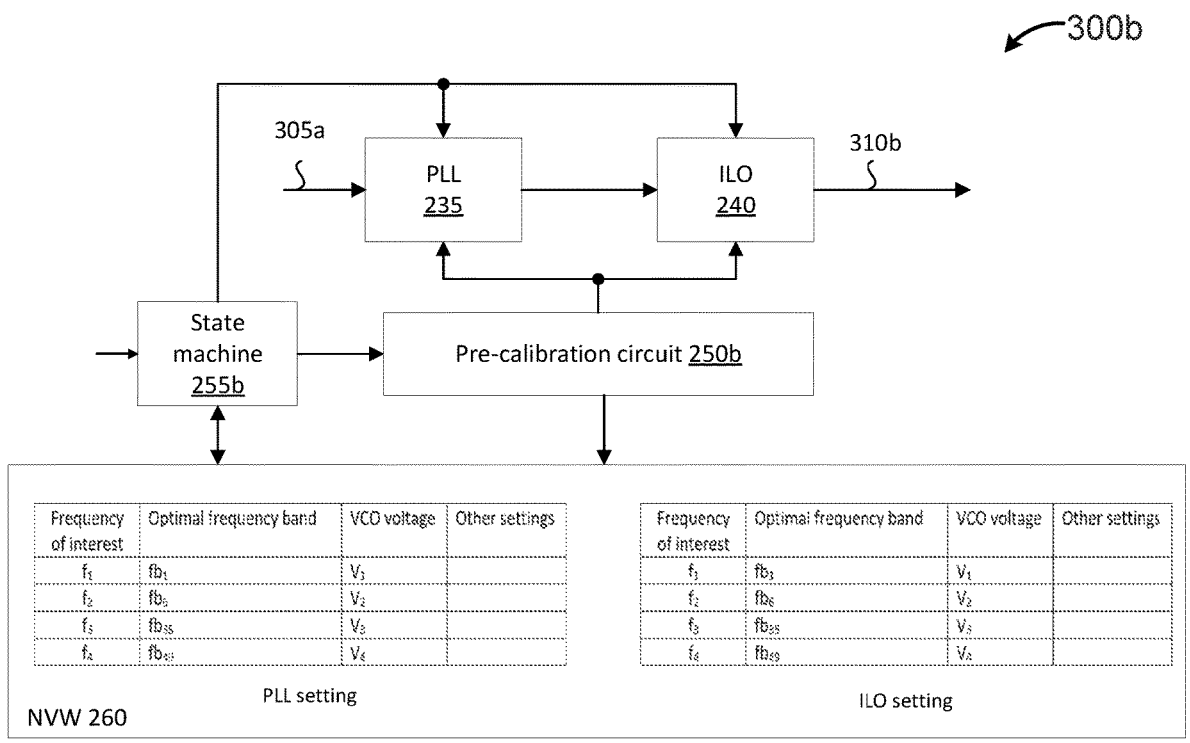
FIG. 3B depicts another exemplary clock signal generator embedded in the FPGA.

FIG. 3B depicts another exemplary clock signal generator embedded in the FPGA. An exemplary clock signal generator 300b includes a controllable frequency circuit. The controllable frequency circuit includes a PLL (e.g., the PLL 235) connects with an ILO (e.g., the ILO 240) in series. The controllable frequency circuit receives the input clock signal 350a and generates an output clock signal 310b. In some embodiments, the sequence of the PLL 235 and the ILO 240 may be changed.

The clock signal generator 300b also includes a pre-calibration circuit 250b connected to both the PLL 235 and the ILO 240. When used in a SERDES, multiple frequencies may be used. The multiple frequencies may be predetermined by the user. The pre-calibration circuit 250b may step through various frequency bands and monitor the VCO voltage to see if the VCO 245 is within an ideal range. When the PLL 235 and ILO 240 are locked, a corresponding frequency band and operational settings to generate the locked frequency may be obtained.

The pre-calibration circuit 250b is controlled by a state machine 255b. The state machine 255b controls the pre-calibration circuit 250 to start the pre-calibration at startup and stop the pre-calibration when all predetermined frequencies have obtained corresponding frequency band selections and operational settings. A lookup table is established during startup calibration and may be used during rate change. In this depicted example, the lookup table is stored in a nonvolatile memory (e.g., the NVM 260).

The state machine 255, which may be configured with a user interface, allows the user to select a frequency band and operation settings in a manual override mode from the lookup table during PLL rate change and resets the PLL 235 and the ILO 240 with the selected frequency band and operational settings. By directly selecting adaption values stored from startup calibration, there is no longer a need to sweep through different PLL and ILO frequency bands during PLL and ILO lock. Therefore, the lock time is reduced significantly. In some embodiments, the pre-calibration circuit 250b may be configured to calibrate other SERDES adaptation parameters. For example, decision feedback equalizer (DFE) parameters and/or clock data recovery (CDR) parameters may be pre-calibrated and stored. The pre-calibration may reduce the adaption and link lock time for the SERDES as well.

Although the depicted figures present illustrative hardware implementations using circuits, some or all of the functions of the state machine 255 may be implemented by a general purpose processor (e.g., microcontroller) executing a program of instructions that perform the described operations.

FIG. 4 depicts a flow chart of an exemplary method to pre-calibrate the controllable frequency circuit. A method 400 to pre-calibrate the controllable frequency circuit 234, 240 in the clock signal generator 300b is discussed. The method 400 includes, at 405, triggering a calibration routine by enabling an automatic frequency band selection of a pre-calibration circuit (e.g., the pre-calibration circuit 250b). The triggering may be controlled by a state machine (e.g., the state machine 255b). At 410, a state machine (e.g., the state machine 255b) introduces a variable n and initializes the variable n equal to 1. At 415, the state machine 255b set the PLL 235 to a first predetermined frequency (e.g., $f_1$). At 420, the PLL 235 and ILO 240 in the controllable frequency circuit are reset. At 425, the state machine dynamically monitors whether the controllable frequency circuit is locked with the first predetermined frequency. At 430, if the controllable frequency circuit is locked, the state machine 255b reads the PLL and ILO frequency band selection and parameter settings of the first predetermined frequency and stores the frequency band selection and parameter settings in memory (e.g., the NVM 260).

At 430, when there are more predetermined frequencies (e.g., $f_2$, $f_3$, $f_4$) needed by the user later, the state machine 255b increments the variable n at 435 and loops back to 415. If all predetermined frequencies have a corresponding frequency band selection and operational setting, then at 440, the state machine 255b disables the calibration routine by disabling the automatic frequency band selection of the pre-calibration circuit 250b. The pre-calibration is then finished.

Figure 5:
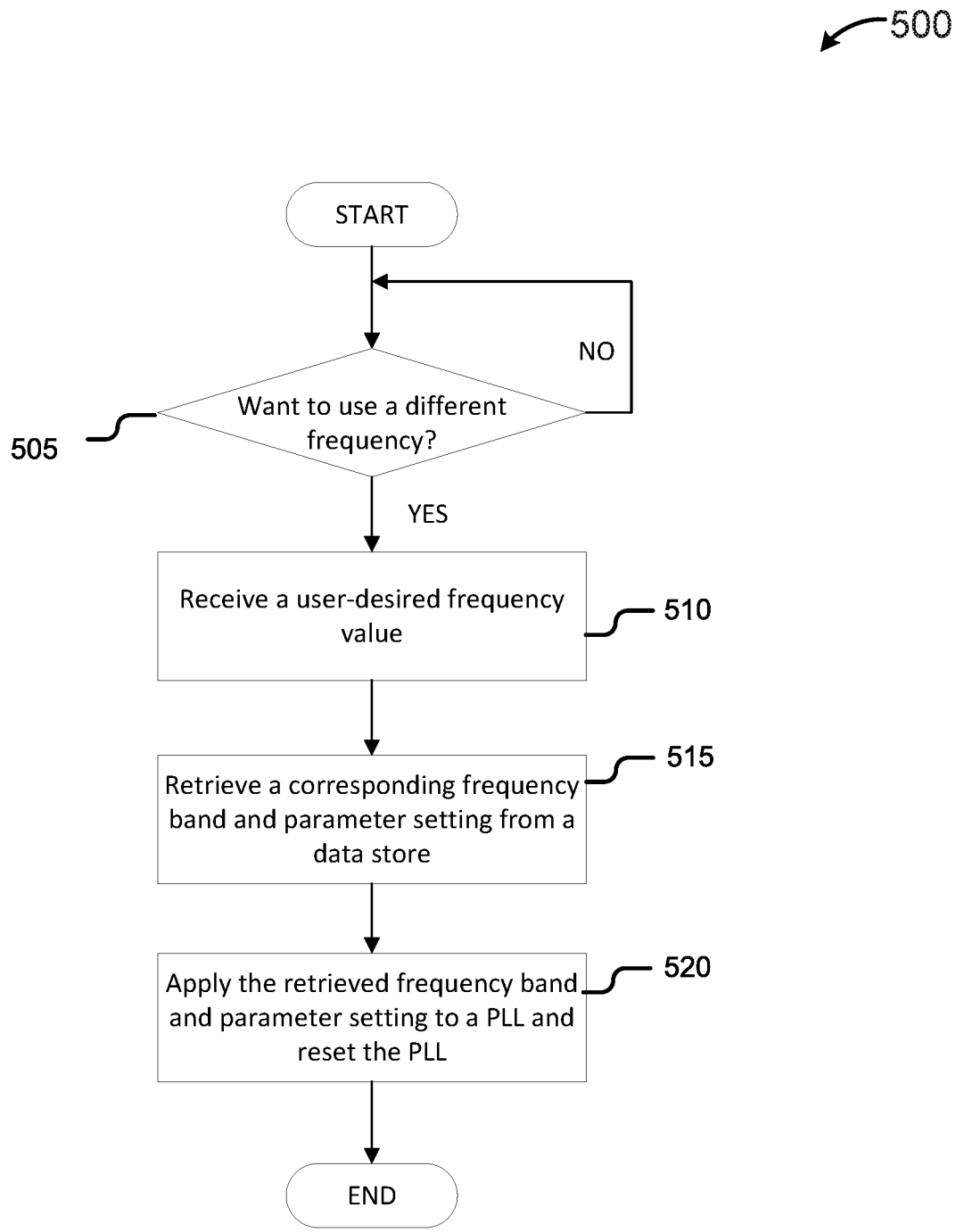
FIG. 5 depicts a flow chart of an exemplary run-time method to calibrate the controllable frequency circuit.

FIG. 5 depicts a flow chart of an exemplary run-time method to calibrate the controllable frequency circuit. A run-time method 500 includes, at 505, a state machine 255a, 255b dynamically determines whether a user wants to configure the controllable frequency circuit to generate a different frequency. If yes, at 510, the state machine receives a user-desired frequency value through a user interface, for example. At 515, the state machine 255a, 255b retrieves a corresponding frequency band and parameter settings from a data store (e.g., the NVM 260).

At 520, the state machine applies the retrieved frequency band and parameter settings to the controllable frequency circuit and resets and the controllable frequency circuit.

In some embodiments, when the controllable frequency circuit (e.g., the only includes a PLL (e.g., the PLL 235), the lookup table may only include one lookup table for the PLL 235. The state machine (e.g., the state machine 255a) may then apply the retrieved corresponding frequency band and parameter settings to the PLL 235.

Although various embodiments have been described with reference to the figures, other embodiments are possible. For example, the clock signal generator may include more than one PLLs and/or more than one ILOs. The pre-calibration circuit may calibrate the PLLs and/or the ILOs to obtain one or more desired frequencies and/or phases. In some embodiments, each transceiver in the FPGA may be calibrated by an independent pre-calibration circuit. In some embodiments, two or more transceivers in the FPGA may share one pre-calibration circuit. In some embodiments, each pre-calibration circuit may be controlled by a corresponding state machine. In some embodiments, two or more pre-calibration circuits may be controlled by the same state machine.

Some aspects of embodiments, such as the state machine 255 access of the lookup table may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data store, at least one input, and/or at least one output. The data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

Although various embodiments may be implemented using reconfigurable programmable logic blocks (e.g., FPGA), other embodiments may be implemented in fixed instantiations (e.g., ASIC) or a single integrated circuit (e.g., SoC). While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Suitable processors for the execution of a program of instructions include, by way of example and not limitation, both general and special purpose microprocessors, which may include a single processor or one of multiple processors. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits), or combined in a single integrated circuit (e.g., SoC). In some embodiments, the processor and the memory can be supplemented by, or incorporated in programmable logic devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. An exemplary embodiment may be implemented in a computer system that includes a graphical user interface and/or an Internet browser. To provide for interaction with a user, some implementations may be implemented on a computer having a display device, such as an LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from a source to a receiver over a dedicated physical link (e.g., fiber optic link, infrared link, ultrasonic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

Various examples of modules may be implemented using circuitry, including various electronic hardware. By way of example and not limitation, the hardware may include transistors, resistors, capacitors, switches, integrated circuits and/or other modules. In various examples, the modules may include analog and/or digital logic, discrete components, traces and/or memory circuits fabricated on a silicon substrate including various integrated circuits (e.g., FPGAs, ASICs, SoC). In some embodiments, the module(s) may involve execution of preprogrammed instructions and/or software executed by a processor. For example, various modules may involve both hardware and software.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. An integrated circuit comprising:
a controllable frequency circuit operable at frequencies within each of a plurality of frequency bands;
a data store configured to store operational settings associated with each frequency of the plurality of frequency bands;
a pre-calibration circuit operable to pre-calibrate the controllable frequency circuit;
a state machine coupled to the controllable frequency circuit and the data store, configured to:
select a predetermined frequency band in response to a command signal;
retrieve, from the data store, operational settings associated with the predetermined frequency band; and,
apply, to the controllable frequency circuit, the retrieved operational settings; and
enable the pre-calibration circuit to perform an auto frequency band selection for the controllable frequency circuit to generate the operational settings.

2. The integrated circuit of claim 1, wherein the controllable frequency circuit comprises a phase-locked loop (PLL).

3. The integrated circuit of claim 2, wherein the PLL comprises a voltage-controlled oscillator (VCO).

4. The integrated circuit of claim 3, wherein the pre-calibration circuit is further operable to:
step through various ones of the frequency bands and monitor the VCO voltage; and
determine if the VCO voltage is within an ideal range.

5. The integrated circuit of claim 1, wherein the controllable frequency circuit comprises an injection-locked oscillator (ILO).

6. The integrated circuit of claim 1, wherein the command signal is associated with a change of operation in a first one of the frequency bands to a second one of the frequency bands.

7. The integrated circuit of claim 1, wherein the pre-calibration circuit is further configured to pre-calibrate decision feedback equalizer (DFE) parameters of a serializer/deserializer (SERDES) link.

8. The integrated circuit of claim 1, wherein the pre-calibration circuit is further configured to pre-calibrate clock data recovery (CDR) parameters of a serializer/deserializer (SERDES) link.

9. The integrated circuit of claim 1, wherein the state machine is further configured to disable the pre-calibration circuit in response to generation of the operational settings.

10. The integrated circuit of claim 1, wherein the state machine is further configured to control the pre-calibration circuit to start pre-calibration at startup.

11. A method to configure a controllable frequency circuit, comprising:
receiving a user command signal, by a state machine, to configure a controllable frequency circuit to generate a desired frequency;
selecting a predetermined frequency band in response to the command signal;
retrieving corresponding operational settings associated with the predetermined frequency band; and,
applying the retrieved operational setting to the controllable frequency circuit,
wherein the corresponding operational settings are pre-calibrated by:
predetermining one or more desired frequencies $f_n$ to be generated by the controllable frequency circuit; and
enabling, by the state machine, a pre-calibration circuit to perform an automatic frequency band selection.

12. The method of claim 11, wherein the controllable frequency circuit comprises a phase-locked loop (PLL).

13. The method of claim 12, wherein the PLL comprises a voltage-controlled oscillator (VCO).

14. The method of claim 11, wherein the controllable frequency circuit comprises an injection-locked oscillator (ILO).

15. The method of claim 14, wherein the ILO comprises a voltage-controlled oscillator (VCO).

16. The method of claim 11, wherein the controllable frequency circuit comprises a phase-locked loop (PLL) connected with an injection-locked oscillator (ILO) in series.

17. The method of claim 11, wherein pre-calibration of the corresponding operational settings further includes:
setting the controllable frequency circuit to a frequency $f_n$;
reading and storing a corresponding frequency band and operational parameters in a data store when the frequency $f_n$ is locked; and,
disabling the automatic frequency band selection until each of the one or more frequencies $f_n$ has a corresponding frequency band and operational parameters.

18. The method of claim 17, wherein the pre-calibration circuit further precalibrates decision feedback equalizer (DFE) parameters of a serializer/deserializer (SERDES) link.

19. The method of claim 17, wherein the pre-calibration circuit further precalibrates clock data recovery (CDR) parameters of a serializer/deserializer (SERDES) link.

20. The method of claim 11, wherein the command signal is associated with a change of operation in a first one of the frequency bands to a second one of the frequency bands.

* * * * *

UNITED STATES PATENT AND TRADEMARK OFFICE
CERTIFICATE OF CORRECTION

PATENT NO. : 10,812,089 B2
APPLICATION NO. : 16/357169
DATED : October 20, 2020
INVENTOR(S) : Caleb S. Leung Page 1 of 1

It is certified that error appears in the above-identified patent and that said Letters Patent is hereby corrected as shown below:

In the Claims

Column 12, Line 42, Claim 18, delete "precalibrates" and insert -- pre-calibrates --, therefor.

Column 12, Line 46, Claim 19, delete "precalibrates" and insert -- pre-calibrates --, therefor.

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*